United States Patent
Choquette et al.

(10) Patent No.: US 6,931,042 B2
(45) Date of Patent: Aug. 16, 2005

(54) LONG WAVELENGTH VERTICAL CAVITY SURFACE EMITTING LASER

(75) Inventors: Kent D. Choquette, Urbana, IL (US); John F. Klem, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 685 days.

(21) Appl. No.: 09/871,492

(22) Filed: May 31, 2001

(65) Prior Publication Data

US 2001/0050934 A1 Dec. 13, 2001

Related U.S. Application Data

(60) Provisional application No. 60/208,452, filed on May 31, 2000.

(51) Int. Cl.[7] ................................................. H01S 5/00
(52) U.S. Cl. ............................. 372/43; 372/44; 372/68; 372/103
(58) Field of Search ............................. 372/43–46, 68, 372/103

(56) References Cited

U.S. PATENT DOCUMENTS

| | | | |
|---|---|---|---|
| 4,908,686 A | 3/1990 | Maserjian | |
| 5,424,559 A | 6/1995 | Kasahara | |
| 5,557,627 A | 9/1996 | Schneider, Jr. et al. | |
| 5,719,894 A | 2/1998 | Jewell et al. | 372/45 |
| 5,719,895 A | 2/1998 | Jewell et al. | 372/45 |
| 5,805,624 A | 9/1998 | Yang et al. | 372/45 |
| 5,825,796 A | 10/1998 | Jewell et al. | 372/45 |
| 5,903,589 A | 5/1999 | Jewell | 372/45 |
| 5,912,913 A | 6/1999 | Kondow et al. | 372/45 |
| 5,936,266 A | 8/1999 | Holonyak, Jr. et al. | 257/106 |
| 5,956,363 A * | 9/1999 | Lebby et al. | 372/46 |
| 5,960,018 A | 9/1999 | Jewell et al. | 372/45 |
| 6,014,395 A | 1/2000 | Jewell | 372/45 |
| 6,052,398 A * | 4/2000 | Brillouet et al. | 372/46 |
| 6,150,604 A * | 11/2000 | Freundlich et al. | 136/253 |

FOREIGN PATENT DOCUMENTS

| | | | | |
|---|---|---|---|---|
| EP | 0 822 630 A1 | 2/1998 | | |
| EP | 0 822 630 A1 | 4/1998 | | H01S/3/085 |
| JP | HEI 5-297128 | 6/1995 | | 3/18 |
| WO | WO 98/07218 | 2/1998 | | |

OTHER PUBLICATIONS

J. Boucart et al., 1–m W CW–RT Monolithic VCSEL at 1.55 μm, IEEE Photonics Technology Letters, Jun. 1999, pp. 629–631, vol. II, No. 6.

Shiro Sakai et al., Band Gap Energy and Band Lineup of III–V Alloy Semiconductors Incorporating Nitrogen and Boron, Jpn. J. Appl. Phys., Oct. 1993, pp. 4413–4416, vol. 32 Part 1, No. 10.

M. C. Larson et al., GaInNAs–GaAs Long–Wavelength Vertical–Cavity Surface–Emitting Laser Diodes, IEEE Photonics Technology Letters, Feb. 1998, pp. 188–190, vol. 10, No. 2.

(Continued)

Primary Examiner—Tom Thomas
Assistant Examiner—Matthew E. Warren
(74) Attorney, Agent, or Firm—John P. Hohimer (57) ABSTRACT

Selectively oxidized vertical cavity lasers emitting near 1300 nm using InGaAsN quantum wells are reported for the first time which operate continuous wave below, at and above room temperature. The lasers employ two n-type $Al_{0.94}Ga_{0.06}As$/GaAs distributed Bragg reflectors each with a selectively oxidized current aperture adjacent to the active region, and the top output mirror contains a tunnel junction to inject holes into the active region. Continuous wave single mode lasing is observed up to 55° C.

21 Claims, 5 Drawing Sheets

OTHER PUBLICATIONS

Masahiko Kondow et al., Gas–Source Molecular Beam Epitaxy of $GaN_xAs_{1-x}$ Using a N Radical as the N Source, Jpn. J. Appl. Phys., Aug. 1994, pp. 1056–1058, vol. 33, Part 2, No. 8A.

Masahiko Kondow et al., Room–Temperature Pulsed Operation of GaInN As Laser Diodes with Excellent High–Temperature Performance, Jpn J. Appl. Phys., Nov. 1996 pp. 5711–5713, vol. 35, Part 1, No. 11.

K.L.Lear, A. Mar, K.D. Choquette, S.P. Kilcoyne, R.P. Schneider, Jr., and K.M. Geib, "High–Frequency Modulation of Oxide Confined Vertical Cavity Surface Emitting Lasers," *Electronics Letters,* vol. 32, pp. 457–458, Feb. 29, 1996.

N. Ohnoki, F. Koyama and K. Iga, "Super–Lattice AlAs/AlInAs for Lateral–Oxide Current Confinement in InP–Based Lasers," *Journal of Crystal Growth,* vol. 195, pp. 603–608, 1998.

Lear K L et al. "High–frequency modulation of oxide–confined vertical cavity surface emitting lasers" Electronics Letter, IEE Stevenage, GB, vol. 32, No. 5, 29 Feb. 1996, pp. 457–458.

Ohnoki N et al. "Super–lattice A1As/A1InAs for lateral–oxide current confinement in InP–based lasers" Journal of Crystal Growth, North–Holland Publishing Co. Amsterdam, NL, vol. 195, No. 1–4, Dec. 15, 1998, pp. 603–608.

\* cited by examiner

OPTIMIZE $T_{SUB}$ BASED ON $\lambda_{PL}$, NOT $I_{PL}$

OPTIMIZE $P_{RF}$ BASED ON $I_{PL}$

LONG WAVELENGTH VERTICAL CAVITY SURFACE EMITTING LASER

CROSS-REFERENCE TO RELATED APPLICATIONS

This application claims the benefit of U.S. provisional patent application 60/208,452, filed May 31, 2000, the contents of which are hereby incorporated by reference.

This invention was made with Government support under Contract No. DE-AC04-94AL85000 awarded by the U.S. Department of Energy. The Government has certain rights in this invention.

FIELD OF THE INVENTION

The present invention relates generally to vertical cavity surface emitting lasers ("VCSEL"), and more particularly, to a VCSEL that emits light at a nominal wavelength of 1300 nm or higher.

BACKGROUND

Vertical cavity surface emitting laser (VCSEL) sources emitting at 850 nm have been widely and rapidly adopted into Gigabit Ethernet and other applications. Short wavelength VCSELs are particularly suitable for multi-mode optical fiber local area networks due to their reliability, reduced threshold current, circular output beam, and inexpensive and high volume manufacture. However, there is strong interest in developing VCSELs that emit at long wavelengths, such as in the 1240 nm to 1600 nm regime. VCSELs that emit at 1300 nm, for example, may be used to leverage high bandwidth single mode fiber that is often already installed as well as to operate at the dispersion minimum of silica optical fiber.

SUMMARY OF THE INVENTION

A preferred embodiment of the present invention provides a continuous wave VCSEL that emits at a nominal wavelength of 1300 nm below, at and above room temperature. In a preferred embodiment, the VCSEL includes InGaAsN/GaAs quantum wells. The laser preferably employs one or more n-type distributed Bragg reflectors and one or more current constriction apertures adjacent to the optical cavity. The top output mirror preferably contains a semiconductor tunnel junction, intracavity contact or other suitable means to inject holes into the active region. The structure preferably reduces resistance and optical losses by reducing the amount of p-type material and placing relatively higher p-type dopant concentrations near standing wave nulls.

BRIEF DESCRIPTION OF THE DRAWINGS

These and other features, aspects, and advantages of the present invention will become better understood with regard to the following description, appended claims, and accompanying drawings, in which:

DETAILED DESCRIPTION OF THE INVENTION

Figure 1:
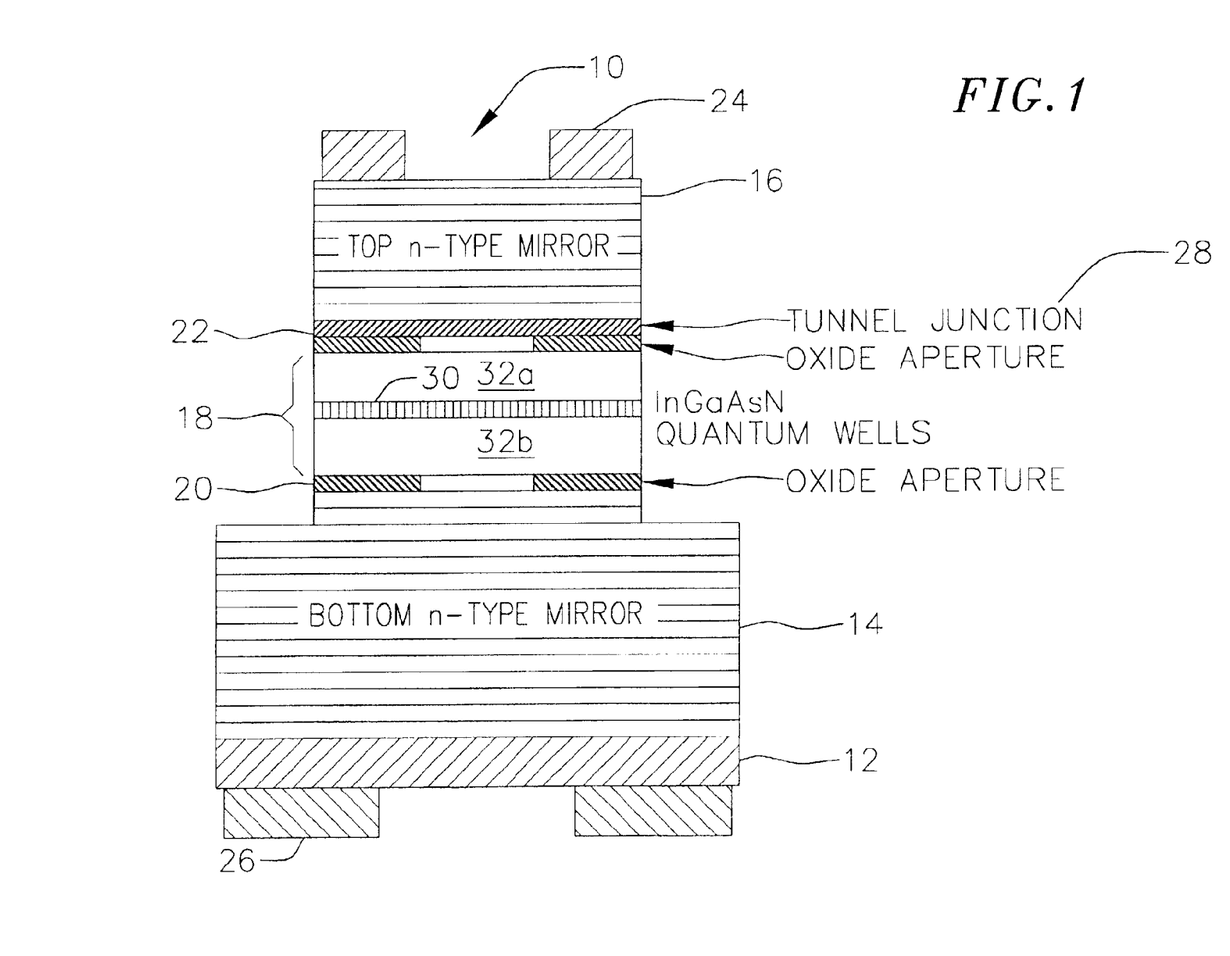
FIG. 1 is a cross-sectional view of an exemplary VCSEL structure according to the present invention.

An exemplary embodiment of the present invention provides a continuous wave light emitting device that emits at a nominal wavelength of 1300 nm below, at and above room temperature. Referring to FIG. 1, an exemplary light emitting device 10 is a layered structure in which lasing light is emitted in a vertical direction, that is perpendicular to the planes of the layers. An exemplary light-emitting device 10 according to the present invention may be formed from III-V or II-VI compound semiconductor materials with embodiments of the invention preferably being in the form of a vertical-cavity surface-emitting laser (VCSEL). The VCSEL preferably exhibits continuous wave single mode lasing up to, at or above 55° C.

Conventional VCSEL designs utilize a thin active region, typically on the order of one wavelength of the emitted light, to achieve a low threshold current. However, such thin active regions have a single pass optical gain of approximately 1%, so that upper and lower mirrors having reflectivities greater than 99% are typically included to achieve lasing. Conventional VCSEL designs typically utilize upper and lower epitaxially-grown semiconductor distributed Bragg reflector (DBR) mirrors to achieve the required reflectivities. The upper and lower mirrors may be doped with appropriate dopants to have opposite conductivity types so that the lower mirror, the active region and the upper mirror form a p-i-n structure. A unique challenge for long wavelength VCSELs relative to 850 nm VCSELs is that the optical absorption of the p-type doping required for a p-type DBR mirror may be as much as ten times higher in the 1240–1600 nm range.

In a first embodiment of the present invention, the semiconductor light-emitting device 10 comprises a plurality of compound semiconductor layers epitaxially-grown on a semiconductor substrate 12. The semiconductor layers preferably form a lower mirror stack 14 above the substrate, an upper mirror stack 16 above the lower mirror stack, an active region 18 sandwiched between the mirror stacks, and upper and lower oxidation aperture 22 and 20 respectively located between the active region and the upper and lower mirror stacks. The oxidation apertures 20 and 22 are also referred to hereinafter as oxide aperture layers or control layers. The semiconductor layers are etched downward at least to the lower oxidation aperture 20 as shown in FIG. 1, thereby forming a mesa. An upper electrode 24 is deposited above the upper mirror stack 16; and a lower electrode 26 (also known as a contact) may be deposited below the substrate 12. An optional insulation layer (not shown) may be provided to protect the etched mesa, and to provide support for the upper electrode 24.

In an exemplary embodiment, the upper and lower mirror stacks are preferably n-type distributed Bragg reflector mirrors. The n-type mirrors 14 and 16 are preferably composed of one quarter wavelength thick alternating layers of AlGaAs and GaAs. The utilization of two relatively low doped n-type mirrors advantageously reduces the free carrier absorption, which may be excessive at long wavelengths in p-type materials. A preferred embodiment of the invention incorporates a semiconductor tunnel junction 28 into the high index GaAs layer nearest to the active region 18 in the upper mirror layers 16 to accommodate unipolar n-type mirrors. The heavily doped tunnel junction 28 is preferably positioned at a node (i.e. a minimum) of the longitudinal field to reduce or minimize absorption while enabling the conversion of electrons to holes for injection into the active region. The oxidation apertures 20 and 22 may be, for example, low index layers of AlGaAs which are selectively oxidized in part to provide electrical and optical confinement.

An exemplary VCSEL 10 may be grown on a GaAs substrate 12, preferably using molecular beam epitaxy or other suitable methods. The lower mirror 14 is grown above the substrate and is a unipolar structure, having a doping type that is preferably of the same polarity as the substrate 12. The lower oxidation layer 20 is epitaxially grown on the lower mirror 14 with an active region 18 grown above the lower oxidation layer 20 and mirror 14. The active region 18 preferably comprises at least one active layer 30 sandwiched between a pair of barrier layers 32. The upper oxidation layer 22 is grown on the upper barrier layer 32a and the tunnel junction 28 is formed in a high index GaAs layer nearest to the optical cavity in the upper mirror layers. The upper mirror layers 16 are then grown on the upper surface of the tunnel junction 28.

To electrically contact the VCSEL, upper and lower electrodes 24 and 26 are preferably deposited above the upper mirror 16 and below the active region 18 respectively. The upper electrode 24 may be deposited before or after formation of the mesa. If the upper electrode 24 is deposited before the formation of the mesa and patterned by an etching or lift off step, the upper electrode may either be protected by an overlying layer deposited and patterned for use as an etch mask, or the upper electrode may form at least a part of the etch mask. In one embodiment the upper electrode 24 may be formed, for example, by depositing an n-type metallization such as AuGe/Ni/Au above the mirror stack 16, and defining an annular opening therein by a lithographic masking and lift-off process. Likewise, the lower electrode 26 comprises an n-type metallization such as AuGe/Ni/Au provided either full-surface metallization on the lower surface of the n-type substrate 12, or patterned to provide an annular aperture therethrough centered about the active region 18. One of skill in the art will appreciate that for manufacturability, packaging or other purposes two top side electrodes or contacts may be used to electrically contact the VCSEL above and below the active region 18.

In an exemplary embodiment, the annular opening formed through the upper electrode 24 is generally sized to be at least as large in diameter as the oxide-free portion of the upper oxide layer 22, but smaller in diameter than the top surface of the mesa. In this way, light may be efficiently coupled out from the light-emitting device 10 through the central annular opening while allowing the electrical current to be efficiently coupled from the upper electrode 24 into the upper mirror stack 16, and therefrom to the active region 18. The semiconductor substrate 12 is preferably GaAs, that may be doped, for example, n-type with Si. A semiconductor buffer layer such as a thin layer of GaAs doped with Si may initially be epitaxially grown on the substrate 12 prior to the growth of the lower mirror stack 14. The GaAs substrate 12 is transmissive for wavelengths above 900 nm. Therefore, in some cases, light may be emitted from the lower side of the VCSEL 10 through an annular aperture formed in the lower electrode 26 to enable backside monitoring of the laser output intensity for control thereof to maintain a consistent laser output over time.

In the preferred embodiment, the upper and lower mirror stacks are doped n-type. The n-type mirrors 14 and 16 are preferably composed of quarter-wavelength-thick alternating layers of $Al_{0.94}Ga_{0.06}As$ and GaAs for operation at a wavelength near 1300 nm. One of skill in the art will appreciate that the Al fraction of the AlGaAs n-type mirror layers may vary, preferably in the range of about 0.8–0.96. Further, the upper limit of the Al fraction may be determined by the Al composition of the alloy used to form the oxide apertures. In the described exemplary embodiment, the upper and lower mirrors 16 and 14 are preferably highly reflective, preferably >99% reflectivity, to provide a high quality factor, Q, for the resonant optical cavity formed between the mirror stacks. In addition, the active region 18 is designed to provide sufficient optical gain for lasing action in the cavity over a range of operating currents. The reflectivities of the upper and lower mirror stacks 16 and 14 may be defined during epitaxial growth of the light emitting device 10 by adjusting the number of mirror periods forming each mirror stack. In addition, the reflectivities of the mirror stacks may also be adjusted by adjusting the semiconductor alloy compositions of a high index of refraction semiconductor layer and a low index of refraction layer forming each mirror period. In an exemplary embodiment, the upper mirror stack 16 contains 28 periods and the lower mirror stack 14 contains 33 periods.

Figures 2, 2A, 2B, 2C:
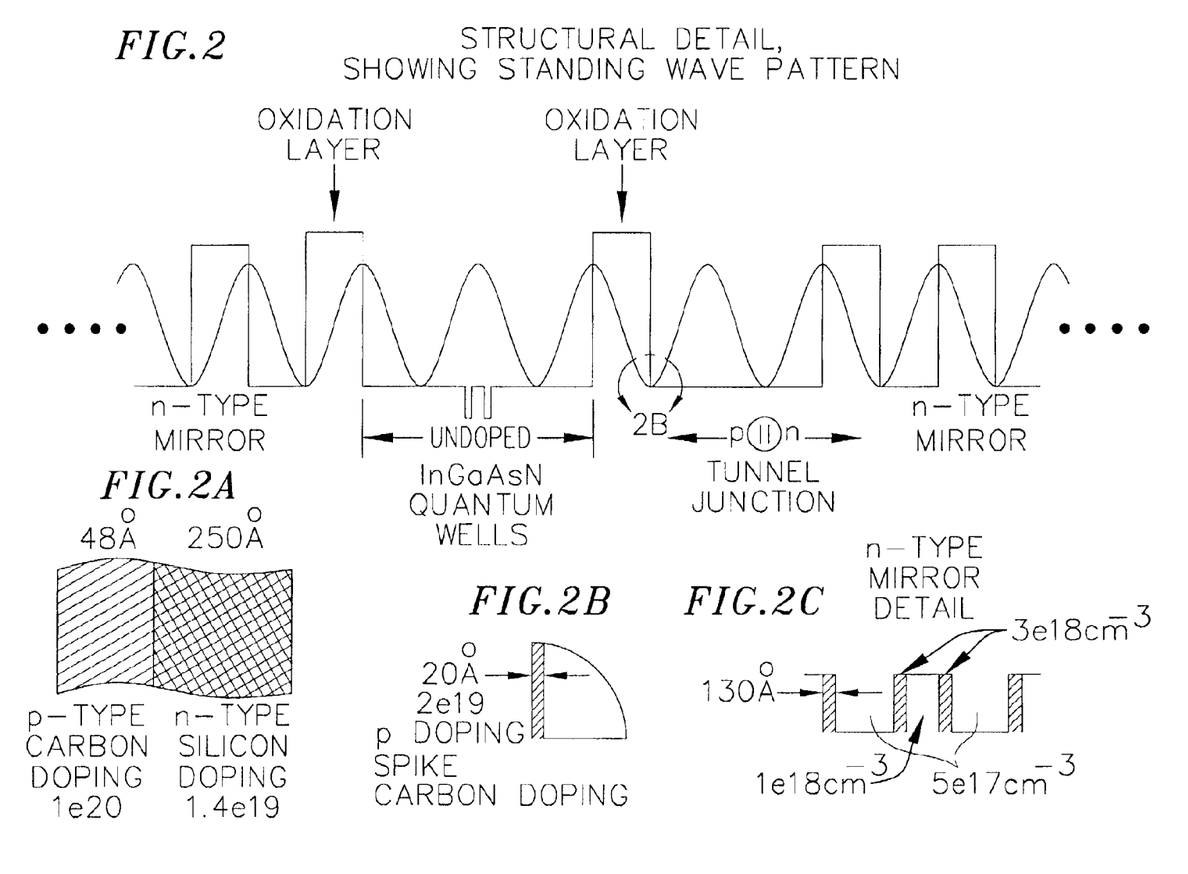
FIG. 2 displays structural details of the exemplary VCSEL with a standing wave pattern of the optical field overlaid with the preferred VCSEL layers.
FIG. 2A is a diagram of a tunnel diode positioned at a standing wave null of the optical field in accordance with an exemplary embodiment of the present invention.
FIG. 2B illustrates an upper oxidation layer with a carbon doping spike at the upper interface in a null in the standing wave pattern.
FIG. 2C illustrates an exemplary mirror design for the VCSEL according to the present invention.

An exemplary design for the upper and lower mirrors 16 and 14 is shown in FIG. 2C. The n-type upper and lower mirrors 16 and 14 are preferably Si doped. The upper and lower mirrors 16 and 14 are designed to reduce the electrical resistance between adjacent semiconductor layers due to offsets in a conduction band, or a valence band or both that might otherwise give rise to a voltage drop across the mirrors. For a VCSEL, this voltage drop increases a bias voltage across the device and produces excess heating therein, thereby deteriorating device efficiency and performance.

In a preferred embodiment of the present invention, the GaAs high index of refraction layers may be doped at concentrations in the range of about $2\times10^{17}$–$2\times10^{18}$ $cm^{-3}$ with a preferred concentration near $5\times10^{17}$ $cm^{-3}$. However, as shown in FIG. 2C the AlGaAs low index of refraction layers also can have increased doping at the layer edges near the adjoining GaAs layers. In a preferred embodiment, the AlGaAs mirror layers are preferably Si doped at a concentration of approximately of $3\times10^{18}$ $cm^{-3}$ for approximately 130 angstroms nearest the layer interfaces to reduce the electrical resistance between adjacent semiconductor layers. The remainder of each AlGaAs layer may be Si doped with a lower concentration in the range of about $5\times10^{17}$–$4\times10^{18}$ cm$^{-3}$ preferably with a concentration of 1×10$^{18}$ cm$^{-3}$. Additionally, the first few periods of each mirror stack proximate to the active region 18 may be grown with a reduced dopant concentration as compared to the remaining periods. The reduced dopant concentration reduces the optical loss in the resonant cavity formed by the upper and lower mirrors 16 and 14 due to dopant impurity absorption and light scattering. Furthermore, the dopant concentration at the top 100–200 angstroms of the upper mirror stack 16 may be increased to about 1×10$^{19}$ cm$^{-3}$ or more to facilitate electrically contacting the upper mirror stack 16 with the upper electrode 24.

The upper and lower oxide apertures 22 and 20 are formed above and below the active region 18 respectively. The upper and lower oxide apertures 22 and 20 preferably comprise a semiconductor alloy containing aluminum. The semiconductor alloy may be oxidized in part after a mesa is formed in the VCSEL structure, preferably to or below the lower oxide layer. The oxidized outer portion of each of the oxide aperture layers has increased resistivity providing lateral current constriction to control transverse higher order modes. The current constriction formed by the oxidized portion of the oxide aperture layers preferably reduces the diameter or size of the current aperture below the outside diameter or size formed by the VCSEL electrodes. In addition, an oxide free central portion of the oxide aperture layers preferably remains transmissive to light.

In a preferred embodiment of the present invention, the oxidized outer portion of the upper and lower oxide apertures 22, 20 generally have an annular shape with the oxidation extending inward from one or more etched sidewalls of the mesa. The lateral shape of the annular oxidized portion will depend upon the shape of the mesa (for example, circular, square, rectangular, or elliptical when viewed in the direction of the light emitted from the device 10) and the number of sidewalls exposed to an oxidation process. The lateral shape of the annular oxidized portion of the oxide apertures 20, 22 may also be influenced or controlled by additional factors which may affect the oxidation process including the semiconductor alloy composition of the oxide apertures 20, 22. Crystallographic preferences for oxidation may also be present, for example, due to a grading of the semiconductor alloy composition of the oxide apertures 20, 22 in the growth direction, or strain in the epitaxial layers.

The upper and lower oxide apertures 22, 20 comprise one or more oxide aperture layers having a semiconductor alloy composition or layer thickness that is different from the composition and layer thickness of any of the other compound semiconductor layers. As an example, the oxide aperture layers may be formed from AlAs or preferably from AlGaAs with an aluminum composition higher than the aluminum composition of AlGaAs high-bandgap semiconductor layers in the upper and lower mirror 16, 14. In this example, it is also preferable that the aluminum composition of the oxide layers be higher than any of the layers of the active region 18.

The aluminum composition of the oxide aperture layers may be used to selectively oxidize the semiconductor alloy, converting it to an oxide of aluminum. The lateral extent of oxidation of the oxide layers according to the present invention is greater than any lateral extent of oxidation of the other semiconductor layers having exposed edges in the mesa. This selective oxidation is due to a strong compositional dependence in the lateral oxidation of Al$_x$Ga$_{1-x}$As layers for x in the range of about 0.8 to 1.0. (The oxidation rate of the semiconductor alloy AlGaAs may also be viewed as being suppressed by the addition of small amounts of gallium to the alloy). Preferably, the oxide layers forming the upper and lower oxide apertures 22, 20 have an aluminum composition sufficiently high to provide about a 5:1 or higher increase in the lateral oxidation extent of the oxide layers as compared with other aluminum-containing layers in the mesa.

The oxide apertures 20, 22 are preferably doped with a dopant type that is the same as the mirror layer or tunnel junction layer immediately adjacent to the oxide layer. Thus, the lower oxide aperture 20 that is located between the active region 18 and the lower mirror stack 14, is preferably doped n-type with a Si or other suitable dopant. The dopant density in the lower oxide aperture 20 may be on the order of about 1×10$^{18}$ cm$^{-3}$. The upper oxide aperture 22, located between the active region 18 and the p-type layer of the tunnel junction, is preferably doped p-type with a relatively low doping density of Be, C or other suitable dopant. The dopant density in the upper oxide aperture may be in the range of about 1×10$^{16}$–5×10$^{17}$ cm$^{-3}$, with a preferred density on the order of about 2×10$^{16}$ cm$^{-3}$. One of skill in the art will appreciate that the upper oxidation aperture may be doped with other suitable materials or at higher doping densities with a commensurate increase in the optical loss.

In the described exemplary embodiment, the layer thickness of the annular oxidized portion of the oxide aperture layers may be slightly different from the layer thickness of the central oxide-free portion (due to a change in the chemical composition of the oxidized portion). However, the effective optical thickness (i.e. the layer thickness multiplied by the refractive index, n) of the two portions of the oxide apertures may be significantly different. This large difference in the effective optical thickness is due to the large difference in the refractive index of the oxidized and oxide-free portions of the oxide layers. Thus, the oxide apertures 20, 22 may provide a phase shift of the light in the optical cavity passing through the annular oxidized portion of each oxide aperture layers that is substantially different from the phase shift of the light passing through the central oxide-free portion of the oxide aperture layers. This phase shift is due to the difference in refractive indices of the two portions of the oxide apertures 20, 22. The thickness for the oxide apertures 20, 22 may be chosen to provide a phase shift in the annular oxidized portion that is, for example, substantially equal to a multiple of one-half of the wavelength of the light generated in the active region 18, while the phase shift in the oxide-free portion is substantially equal to a multiple of one-quarter of the wavelength of the light.

A compound semiconductor active region 18 is epitaxially grown sandwiched between the mirror stacks 14 and 16. The active region 18 has a thickness that is preferably an integral multiple of one-half of the wavelength of the light generated in the active region. The active region 18 may be either undoped (i.e. intrinsic, or not intentionally doped); or a portion on either side of the active region may be doped to form a semiconductor p-n or p-i-n junction within the active region 18. The active region may include one or more quantum-wells 30 surrounded by barrier layers as may be preferable for the formation of a VCSEL device 10. The quantum-wells provide quantum confinement of electrons and holes therein to enhance recombination for the generation of the light, and may also include semiconductor layers comprising a plurality of quantum wires or quantum dots therein.

In an exemplary embodiment of the present invention, the active region 18 comprises one or more quantum-well layers 30 containing one or more In$_x$Ga$_{1-x}$As$_{1-y}$N$_y$ quantum wells designed to emit at wavelengths in the range of 1240 nm to 1360 nm. Fractionally the In may range from about 0.3–0.4, and the Nitrogen may range from about 0.01–0.02. In a preferred embodiment, there are two $In_{0.34}Ga_{0.66}As_{0.99}N_{0.01}$ quantum wells, with barrier layers surrounding and separating the quantum wells. The barrier layers preferably have an energy bandgap intermediate between the energy bandgaps of the quantum-well layers 30 and the oxide free portion of the oxidation apertures 20 and 22. In an exemplary embodiment, the optical cavity is one wavelength thick, (i.e. an effective optical thickness that is substantially equal to one wavelength of the lasing light generated by the VCSEL 10). Each quantum well 30 may be in the range of about 3–10 nm thick and is preferably on the order of about 6 nm thick. In addition, each barrier layer may be on the order of about 20 nm thick when separating a pair of adjacent quantum wells and is otherwise about 174 nm thick. The barrier layers may comprise, for example, undoped GaAs.

Alternatively, the optical cavity may further include cladding layers surrounding the barrier layers, in which the cladding layers have an energy bandgap equal to that of the barrier layers or intermediate between the energy bandgap of the barrier layer and the oxide free portion of the oxidation layers. In some cases the barrier layers may comprise the same material as the cladding layer. The cladding layers may have a semiconductor alloy composition that is uniform in the growth direction, forming a separate confinement heterostructure (SCH) active region 18. Alternately, the semiconductor alloy composition of the cladding layers may be graded in the growth direction (i.e. graded from a higher-bandgap to a lower-bandgap alloy composition for the first-grown cladding layer). Similarly, the second grown cladding layer may be graded from a lower-bandgap alloy to a higher-bandgap composition, forming a graded-index separate confinement heterostructure (GRIN-SCH) active region 18.

The number and location of quantum-wells in a VCSEL device 10 may further provide means for increasing the optical gain by maximizing a spatial overlap with an electric field antinode (i.e. maximum) of the light in the resonant optical cavity. The quantum-well layers 30 may be positioned near an antinode of the electric field of the light in the optical cavity to increase the efficiency for light generation therein.

The preferred embodiment incorporates a tunnel junction 28 into the high index GaAs layer nearest to the active region 18 in the upper mirror 16. The tunnel junction 28 injects holes into the active layer without having the absorption that is characteristic of a p-type top output mirror. The heavily doped tunnel junction 28 is preferably positioned at a node of the longitudinal electric field of the light to reduce or minimize absorption while enabling the conversion of electrons to holes for injection into the active region. The preferred embodiment includes low index layers (e.g. AlAs) for the oxide free portions of the oxide apertures 20 and 22 immediately adjacent to each side of the active region 18.

The mesa may be formed by etching down at least to the lower oxide aperture by a wet or preferably a dry etching process such as reactive ion etching (RIE), reactive ion beam etching (RIBE), or the like. The mesa is formed by lithographically patterning the top surface of the upper mirror 16 and depositing thereon a suitable material (for example, silicon nitride, silicon oxide, silicon oxynitride, metal silicides, or refractory metals) as an etch mask. After etching the mesa structure down to or through the lower oxide aperture 20, the etch mask may be left in place to protect the top layer of the upper mirror, or removed prior to the oxidation process. In forming the mesa, the etch depth may be measured in-situ by reflectometry to provide a precise control of the etch depth, and to allow the etch process to be stopped after etching down at least to the lower oxide aperture. In some instances, it may be preferable to etch down beyond the lower oxide aperture to provide more-vertical sidewalls for the mesa for uniform oxidation of one or more oxide apertures. Furthermore, in other embodiment of the present invention, the mesa may be omitted and instead a plurality of trenches or wells or an annular trench may be etched down through the various layers above the active region 18 to permit lateral oxidation to form the oxide apertures.

The oxidation process may be carried out by placing the wafer into a container and heating the wafer to a temperature of about 350 to 500° C. (and preferably between about 400 and 450° C.) under a controlled environment having a high humidity. Such a moist environment may be generated, for example, by flowing a gas, such as nitrogen, through water heated to about 80–95° C. to entrain water vapor, and then directing the moisture-laden gas into the container.

The time required for formation of the annular oxidized portion of the upper and lower oxide apertures 22, 20 depends upon a number of variables. For example, the formation time may vary in accordance with the aluminum composition of the oxide aperture layers forming the oxide aperture 20 and 22, the temperature to which the semiconductor wafer is heated, the thickness of the oxide aperture layers and the lateral extent to which the oxide aperture layers are to be oxidized (i.e. the lateral dimension of the annular oxidized portion). Generally, a 50 nm thick oxide aperture layer will oxidize in about 30 to 150 minutes with an oxidation temperature in the range of about 400 to 450° C. The composition and quality of the aluminum oxide formed by the oxidation process may also be temperature dependent.

After the oxidation process is completed, an insulation layer (not shown) may be deposited onto the semiconductor wafer to protect and passivate the etched mesa and exposed semiconductor layers, and to planarize the light-emitting device 10 formed on the semiconductor wafer. The insulation layer may be formed of any insulating material as is commonly used in the art including polyimides, spin-on-glasses, silicon dioxide, silicon nitride, and the like.

FIG. 2 displays structural details of the 1300 nm VCSEL shown in FIG. 1, overlayed with the standing wave intensity profile of the optical field as a function of vertical position within the VCSEL. The standing wave intensity profile is related to the intensity of the light in the VCSEL. Hence, the standing wave maxima are where the circulating light in the cavity is most intense, and the standing wave minima are where the light is least intense. Light is more readily absorbed by high doped semiconductor materials and less absorbed by low doped materials. Therefore, in an exemplary VCSEL 10 according to the present invention, the tunnel junction 28 is preferably positioned to place the high-doped semiconductor materials therein at a standing wave null in the optical field (i.e. at a node). Advantageously, by placing the high-doped semiconductor materials at the intensity minima, light absorption in the tunnel junction is minimized.

Referring to FIG. 2A, the tunnel junction 28 preferably comprises a p-type layer and an n-type layer. The p-type layer may be in the range of about 10–100 angstroms thick and in an exemplary embodiment is on the order of 48 angstroms thick. The p-type layer of the tunnel junction may be doped with a carbon (C) dopant at a density in the range of about $2\times10^{19}$–$2\times10^{20}$ cm$^{-3}$ and preferably on the order of about $1\times10^{20}$ cm$^{-3}$. The n-type layer of the tunnel junction may be in the range of 50–500 angstroms thick and is preferably on the order of 250 angstroms thick. The n-type layer of the tunnel junction may be doped with a silicon (Si) dopant at a density in the range of about $4\times10^{18}$–$4\times10^{19}$ cm$^{-3}$ and is preferably on the order of approximately $1.4\times10^{19}$ cm$^{-3}$.

In an exemplary embodiment of the present invention the oxide aperture layer forming the upper oxidation aperture is doped p-type, and primarily consists of relatively low density Be dopant, preferably on the order of about $2\times10^{16}$ cm$^{-3}$. The lower doping density reduces absorption of photons traversing one or more oxidation aperture layers forming the upper oxide aperture 22. However, as seen in FIG. 2B the upper oxidation aperture 22 preferably includes a carbon doping spike at the upper interface thereof in a null in the standing wave pattern of the optical field. The carbon doping spike is preferably on the order of 20 angstroms thick with a p-type carbon doping density of approximately $2\times10^{19}$ cm$^{-3}$. The doping spike preferably reduces the resistance at the heterointerface while maintaining low optical loss due to its location at the standing wave null in the optical field.

An exemplary 1300 nm VCSEL with one or more InGaAsN quantum wells 30 is preferably grown on a GaAs substrate using molecular beam epitaxy manufacturing techniques. The technique preferably optimizes the indium and nitrogen incorporation and the substrate growth temperature for optimal quality of the InGaAsN quantum wells. As is known in the art, the actual growth parameters for each epitaxial layer typically vary depending on the particular MBE system used. In one embodiment, the VCSEL may be fabricated using an MBE system with a nitrogen plasma source for adding nitrogen to the InGaAsN quantum wells 30. In a preferred embodiment, the deposition of the InGaAsN quantum wells 30 preferably attempts to increase the concentration of indium and reduce the concentration of nitrogen to obtain a high quality device emitting at a particular wavelength near 1300 nm. Careful attention to growth of each InGaAsN quantum well is needed since increasing the indium concentration tends to increase the emission wavelength but also increases the stress in the quantum well layers, thereby necessitating a reduction in quantum well thickness to avoid stress induced dislocations. However, reducing the well thickness also leads to a reduction in the emission wavelength due to increased quantum confinement. Furthermore, increasing the nitrogen concentration tends to increase the operating wavelength, and further provides strain compensation for the indium. Adding too much nitrogen, however, leads to poor optical quality of the material. Therefore, in a preferred embodiment, the semiconductor alloy composition of each InGaAsN quantum well 30 is optimized to achieve 1300 nm emission without exceeding critical thickness of the quantum wells 30 using a minimum amount of nitrogen therein. In a preferred embodiment nitrogen fraction in each of the InGaAsN quantum wells 30 is at least 0.01 and preferably in the range of 0.01–0.02.

Figure 5A:
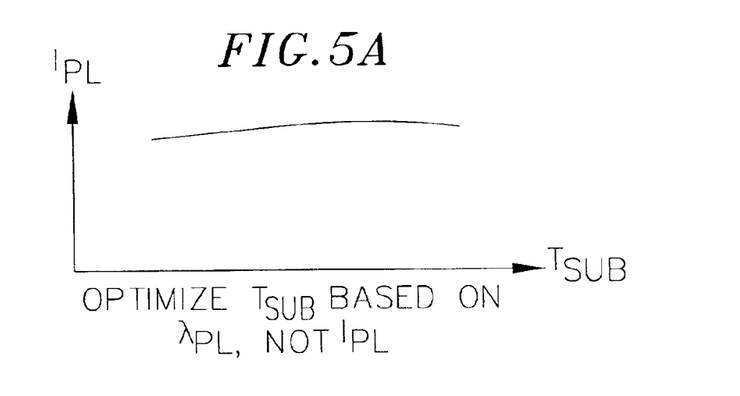
FIG. 5A graphically depicts that PL intensity of the InGaAsN quantum well remains relatively stable with substrate growth temperature, so that growth of the InGaAsN quantum well is preferably optimized with the substrate temperature, $T_{SUB}$, determined by the photo-luminescence wavelength $\lambda_{PL}$, instead of the photoluminescence intensity $I_{PL}$.

Material concentrations may be optimized by controlling the MBE nitrogen plasma conditions as well as the growth temperature of the substrate 12. The operating parameters of the plasma source that may be controlled include the RF power level, aperture size and gas pressure or gas flow rate. FIG. 5C graphically depicts the photoluminescence (PL) intensity from an InGaAsN quantum well 30 versus plasma RF power. The RF power level is preferably reduced to the lowest reasonable level to provide optimal PL intensity. The aperture size and input flow are then adjusted to provide the N flux.

Conventionally, those of ordinary skill in the art use the PL intensity to determine the optimal substrate growth temperature for high quality epitaxial growth of each semiconductor layer with a VCSEL or edge emitting laser, and especially for the quantum wells. However, it has been found that the PL intensity of the InGaAsN quantum well remains relatively stable and independent of substrate growth temperature as shown in FIG. 5A. However, the performance of a particular laser having an InGaAsN quantum well is highly dependent upon substrate growth temperature with a narrow optimal range. Therefore, in the case of InGaAsN, the PL intensity signature does not indicate the optimum substrate growth temperature.

Figure 5B:
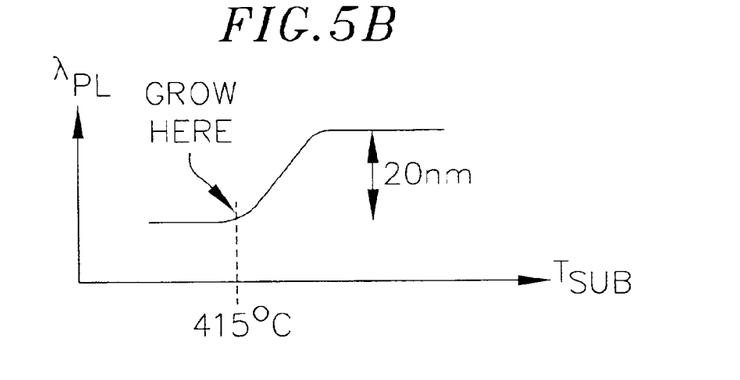
FIG. 5B graphically depicts that the PL wavelength comprises a transition region where the wavelength decreases with decreasing temperature.
Figure 5C:
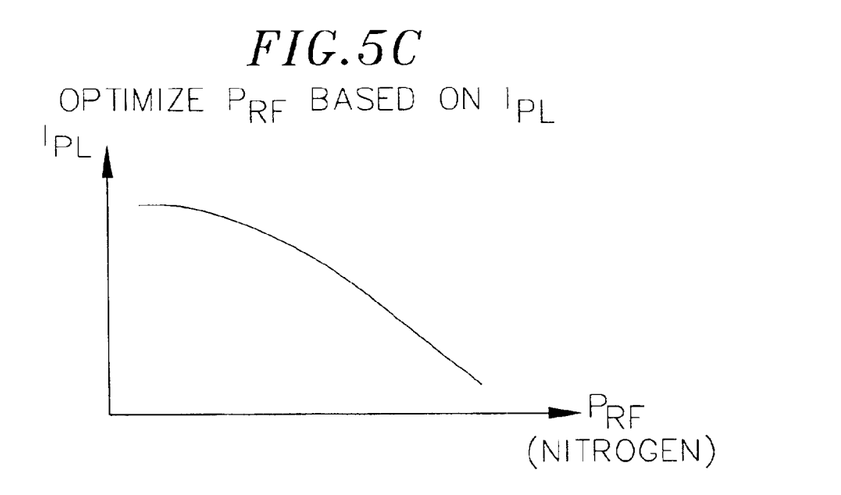
FIG. 5C graphically depicts the PL intensity versus plasma RF power, $P_{RF}$, with the plasma RF power preferably being optimized to provide a high level of photoluminescence intensity $I_{PL}$.

However, we have found that the PL wavelength for an InGaAsN quantum well 30 demonstrates a dependence on the substrate growth temperature as shown in FIG. 5B. Generally, the PL wavelength of InGaAsN may be increased by increasing the nitrogen or indium content. The inclusion of both materials in suitable quantities reduces the strain in the quantum well. However, one would expect that volatile materials like nitrogen would incorporate more strongly at lower substrate growth temperatures thereby lowering the energy bandgap of the InGaAsN. Therefore, one of skill in the art would expect the PL wavelength to increase with decreasing temperature.

As shown in FIG. 5B, however, according to the present invention the PL wavelength is shown to generally comprise a transition region where the wavelength decreases with decreasing temperature contrary to expectation, and outside this transition region the PL wavelength is relatively independent of the growth temperature. This transition region is indicative of an increase in the energy bandgap of the InGaAsN quantum well material with decreasing temperature, which suggests that the nitrogen may be distributed more homogenously with less phase separation or clustering. The preferred substrate growth temperature according to the present invention, that is typically at the low temperature edge of the transition region, as indicated by the dashed line in FIG. 5B, is at a temperature on the order of about 415° C. Once the location of the narrow growth temperature range of the transition region producing the wavelength shift in FIG. 5B has been located using PL data, it is then preferred to fabricate a plurality of edge emitting lasers emitting at a nominal wavelength of 1300 nm. The edge emitters are preferably similar epitaxial structures grown using different substrate temperatures near the transition region and preferably near the low temperature edge of the transition region. The measured threshold current characteristics for these edge-emitting lasers may then be used to determine the optimal growth temperature for the InGaAsN quantum wells 30 in subsequently grown VCSELs 10. The preferred process methodology enables one to efficiently locate the optimum substrate growth temperature in a systematic and repeatable manner and in a manner that is more simple than growing and testing a plurality of VCSELs at different growth temperatures.

Figure 3:
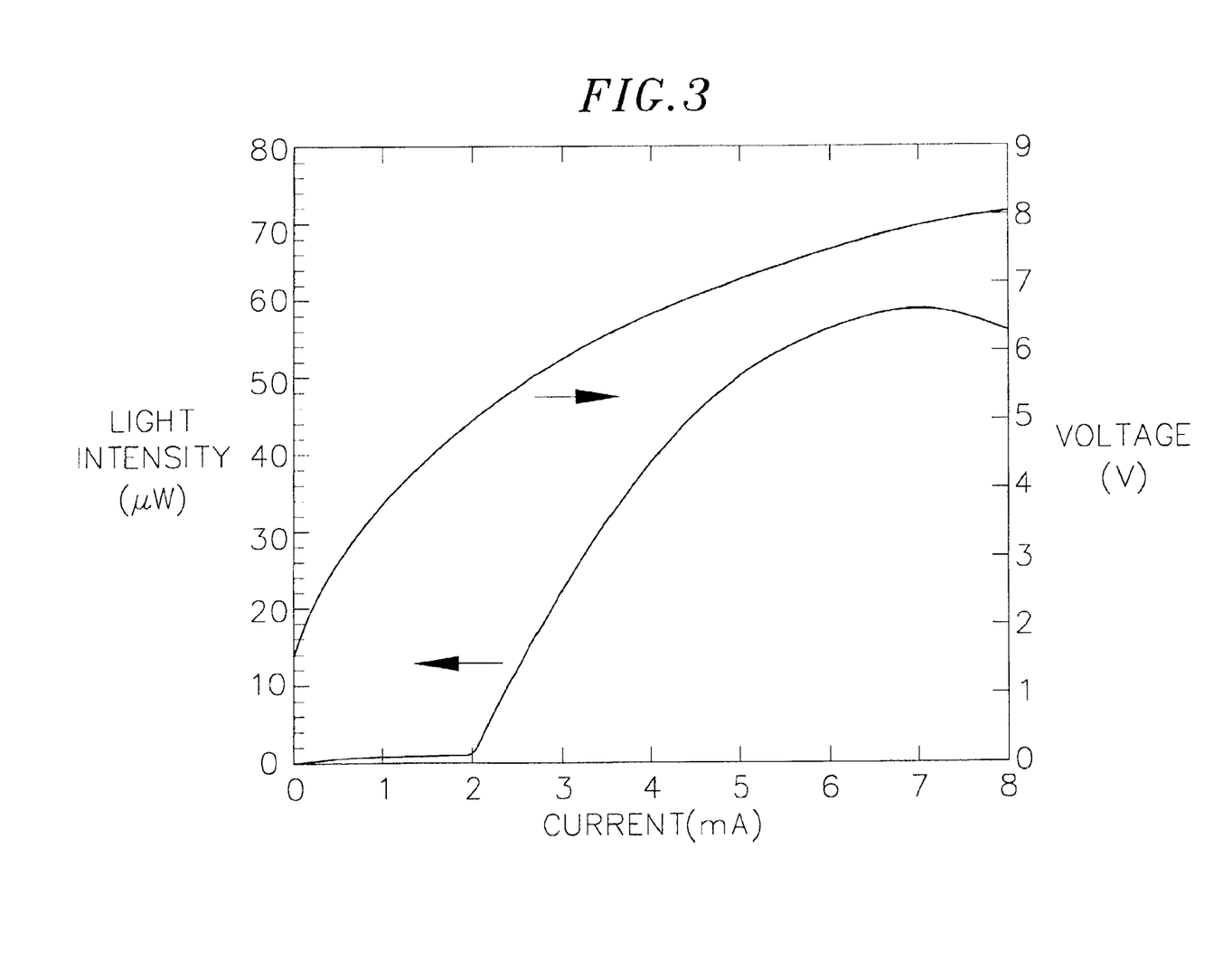
FIG. 3 graphically depicts the room temperature output characteristics of a representative VCSEL with 4.5×4.5 $\mu m^2$ oxide apertures.

FIG. 3 graphically depicts the room temperature operating characteristics of a representative VCSEL with two square $4.5\times4.5$ $\mu$m$^2$ oxide apertures defined by the inside dimension of the oxidized portion of the oxide aperture layers. VCSELs with square apertures varying in size from $2\times2$ up to $12\times12$ $\mu$m$^2$ operated with room temperature threshold currents varying from approximately 2 to 10 mA, with the threshold current increasing with size of the oxide aperture. The broad area threshold current density for each of these VCSELs was on the order of 4 kA/cm². The representative VCSEL 10 of FIG. 3, is preferably fabricated by the oxidation method disclosed in U.S. Pat. No. 5,493,577 which is incorporated herein by reference. It is understood that the VCSEL may be fabricated by any technique known in the art for fabricating VCSELs subject to the modifications described herein.

Figure 4:
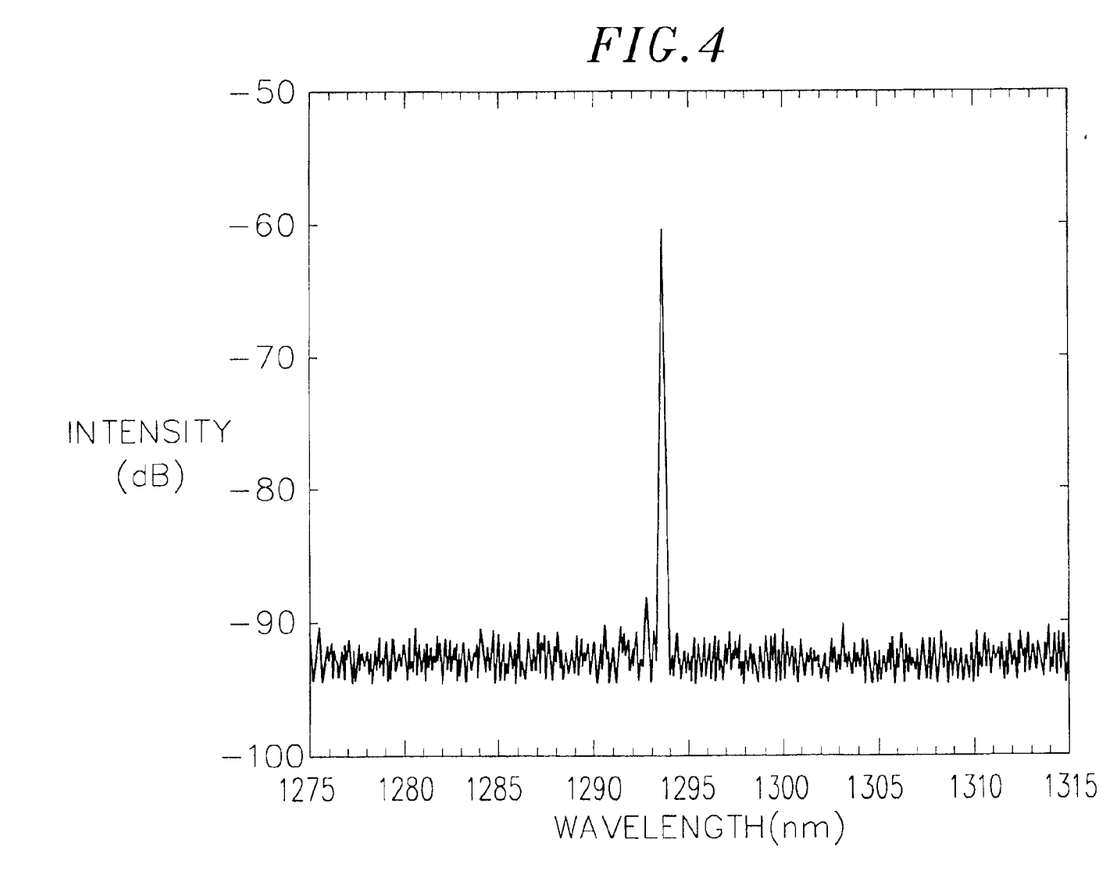
FIG. 4 graphically depicts the corresponding single transverse mode lasing spectrum at 1294 nm with 28 dB side mode suppression.

FIG. 4 graphically depicts the corresponding single transverse mode lasing spectrum at 1294 nm with 28 dB side mode suppression. Single mode output power of 60 μW is obtained at 20° C. and continuous wave lasing is observed up to 55° C. The threshold current monotonically decreases with decreasing temperature (down to 5° C.), which implies that the laser gain maximum is at a wavelength longer than 1294 nm. If the gain maximum is selected to be at a wavelength shorter than the desired emission wavelength, the laser temperature performance may be further improved. The submilliwatt maximum output in FIG. 3 is the combined result of the high reflectivity output coupler and the spectral misalignment between the cavity resonance and the laser gain profile. As will be recognized by one of skill in the art, the relatively high operating voltage in FIG. 3 may be reduced by incorporating compositional mirror grading into the mirror design, such as taught in U.S. Pat. No. 5,568,499, the contents of which are hereby incorporated by reference. Therefore the disclosed mirror structure is by way of example and not by limitation.

VCSEL technology has historically provided the most cost efficient optical link solution for high bandwidth applications, as demonstrated in recent years by their rapid adoption over edge-emitting lasers in the data communications market. A VCSEL preferably has a narrower linewidth than a Fabry-Perot laser for SONET, Ethernet, fiber to the home applications; may include a transparent GaAs substrate for backside monitoring. The exemplary 1300 nm VCSEL enables extended distances and data rates to be realized over single mode optical fiber. The exemplary 1300 nm VCSEL will therefore provide significant cost reductions making increased bandwidth more accessible and cost effective for the telecommunications and Internet infrastructure. The exemplary 1300 nm VCSEL also may be applied in the fiber channel, Gigabit Ethernet, 10-Gigagbit Ethernet, fiber to home markets and any other desired application. Moreover, the exemplary 1300 nm VCSEL may one day render conventional longwave Fabry-Perot and DFB lasers relatively less desirable for many applications.

Although a preferred embodiment of the present invention has been described, it should not be construed to limit the scope of the appended claims. Those skilled in the art will understand that various modifications may be made to the described embodiment. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A vertical cavity surface emitting laser comprising:
   a substrate;
   a first n-type mirror adjacent the substrate;
   an active region including one or more quantum wells, the quantum wells being formed of InGaAsN;
   a second n-type mirror adjacent the active region, the second mirror including a tunnel junction for injecting holes into the active region,
   wherein the laser emits light at a nominal wavelength of 1300 nm.

2. The vertical cavity surface emitting laser of claim 1, wherein the substrate includes GaAs.

3. The vertical cavity surface emitting laser of claim 1, wherein the tunnel junction includes a n-type layer and a p-type layer.

4. The vertical cavity surface emitting laser of claim 3, wherein the p-type layer of the tunnel junction is positioned at or near a standing wave null in optical field.

5. The vertical cavity surface emitting laser of claim 2, further comprising one or more oxide apertures, proximate to the active region, wherein the oxide aperture includes an oxidized portion therein.

6. The vertical cavity surface emitting laser of claim 5 wherein the oxidized portion of the oxide aperture comprises an aluminum oxide.

7. The vertical cavity surface emitting laser of claim 5 wherein the oxide aperture comprises a carbon doped spike positioned at or near a standing wave null in optical field.

8. The vertical cavity surface emitting laser of claim 5, further comprising a mesa extending downward at least to the oxide aperture.

9. The vertical cavity surface emitting laser of claim 1 wherein the first and second n-type mirrors comprise unipolar distributed Bragg reflector mirrors.

10. The vertical cavity surface emitting laser of claim 1 further comprising an upper electrode above the second mirror stack and a lower electrode below the active region.

11. The vertical cavity surface emitting laser of claim 10 wherein the lower electrode includes an annular aperture therein to monitor transmitted output power of the vertical cavity surface emitting laser from light emitted through the annular aperture in the lower electrode.

12. A method of manufacturing a surface emitting laser that emits light at a nominal wavelength of 1300 nm., comprising:
   forming a first n-type mirror on a substrate;
   forming an active region having one or more InGaAsN quantum wells on the substrate;
   forming a current constriction proximate the active region;
   forming a second n-type mirror above the active region; and
   forming a tunnel junction in the second n-type mirror, wherein the tunnel junction comprises an n-type region and a p-type region and the p-type region is positioned at or near a standing wave null in optical field.

13. The method of claim 12 wherein the step of forming a current constriction comprises forming oxide aperture layers proximate to said active region.

14. The method of claim 13 wherein the step of forming oxide aperture layers proximate to said active region comprises forming at least one aluminum alloy layer proximate to said active region.

15. The method of claim 14 further comprising forming a mesa downward from upper most surface of the surface emitting laser to the oxide aperture layers and oxidizing an annular portion of said oxide aperture layers.

16. The method of claim 14 wherein the step of forming oxide aperture layers further comprises doping each aluminum alloy layer with an n-type or p-type dopant.

17. The method of claim 16 wherein the step of doping the aluminum alloy layer with the p-type dopant further comprises forming a carbon doped spike in said aluminum alloy layer, wherein said carbon doped spike is positioned at or near a standing wave null in the optical field.

18. The method of claim 12 wherein the step of forming said second mirror comprises forming one or more pairs of semiconductor mirror layers, wherein one layer in each pair has an index of refraction that is different from the index of refraction of the layer in each pair.

19. The method of claim 18 wherein the step of forming said semiconductor mirror layers comprises forming one quarter wavelength thick alternating layers of AlGaAs and GaAs, wherein said tunnel junction is formed into the GaAs layer nearest said active region.

20. The method of claim 12 further comprising forming an upper electrode above the second mirror and forming a lower electrode below the active region.

21. The method of claim 20 wherein the steps of forming the upper and lower electrodes comprises forming at least one of the upper and lower electrodes having an annular aperture therein.

* * * * *